United States Patent
Platt et al.

(10) Patent No.: US 10,151,025 B2
(45) Date of Patent: Dec. 11, 2018

(54) HELMHOLTZ COIL ASSISTED PECVD CARBON SOURCE

(71) Applicant: SEAGATE TECHNOLOGY LLC, Cupertino, CA (US)

(72) Inventors: Christopher Loren Platt, Fremont, CA (US); Zhaohui Fan, Fremont, CA (US); Samuel Lewis Tanaka, Fremont, CA (US); Chun Wai Joseph Tong, San Jose, CA (US); Thomas Larson Greenberg, Berkeley, CA (US); Xiaoding Ma, Fremont, CA (US)

(73) Assignee: Seagate Technology LLC, Cupertino, CA (US)

( * ) Notice: Subject to any disclaimer, the term of this patent is extended or adjusted under 35 U.S.C. 154(b) by 883 days.

(21) Appl. No.: 14/448,639

(22) Filed: Jul. 31, 2014

(65) Prior Publication Data

US 2016/0035546 A1    Feb. 4, 2016

(51) Int. Cl.
| | |
|---|---|
| H01J 37/34 | (2006.01) |
| C23C 14/35 | (2006.01) |
| H01J 37/32 | (2006.01) |
| C23C 16/26 | (2006.01) |
| C23C 16/50 | (2006.01) |

(52) U.S. Cl.
CPC ............ *C23C 14/35* (2013.01); *C23C 16/26* (2013.01); *C23C 16/50* (2013.01); *H01J 37/32422* (2013.01); *H01J 37/32568* (2013.01); *H01J 37/32669* (2013.01)

(58) Field of Classification Search
CPC .................... C23C 14/566; H01J 37/342
See application file for complete search history.

(56) References Cited

U.S. PATENT DOCUMENTS

| | | | | |
|---|---|---|---|---|
| 4,523,091 | A | * | 6/1985 | Persyk ................ G01T 1/1642 250/214 VT |
| 4,668,365 | A | * | 5/1987 | Foster .................. C23C 16/045 118/50.1 |
| 4,673,477 | A | | 6/1987 | Ramalingam et al. |
| 4,926,791 | A | * | 5/1990 | Hirose .................. C23C 16/511 118/715 |
| 6,051,113 | A | * | 4/2000 | Moslehi ............... C23C 14/568 118/719 |
| 6,103,074 | A | * | 8/2000 | Khominich .......... C23C 14/228 204/192.38 |
| 7,705,331 | B1 | | 4/2010 | Kirk et al. |
| 7,759,134 | B2 | | 7/2010 | Chin et al. |
| 7,807,454 | B2 | | 10/2010 | Oh et al. |
| 7,907,987 | B2 | | 3/2011 | Dempsey |

(Continued)

FOREIGN PATENT DOCUMENTS

| | | |
|---|---|---|
| CN | 1224771 A | 8/1999 |
| CN | 1648283 A | 8/2005 |
| CN | 101068449 A | 11/2007 |

*Primary Examiner* — Joseph A Miller, Jr.

(57) ABSTRACT

The embodiments disclose an apparatus including at least two carbon source deposition tools for emitting electrons, at least two reflective polarity rear button permanent magnets integrated into the carbon source deposition tools for reflecting emitted electrons, and at least two paired polarity Helmholtz coils integrated into the carbon source deposition tools for forming uniform parallel magnetic field lines for confining the emitted electrons to uniformly deposit carbon onto the surfaces of a two-sided media disk.

10 Claims, 14 Drawing Sheets

(56) References Cited

U.S. PATENT DOCUMENTS

| | | | |
|---|---|---|---|
| 7,972,390 B2 | 7/2011 | Blum et al. | |
| 8,071,054 B2 | 12/2011 | Oh et al. | |
| 8,148,900 B1 | 4/2012 | Kirk et al. | |
| 8,190,233 B2 | 5/2012 | Dempsey | |
| 8,734,535 B2 | 5/2014 | Blum et al. | |
| 2002/0036132 A1* | 3/2002 | Brinkmann | C23C 14/351 204/192.12 |
| 2002/0114898 A1* | 8/2002 | Karner | C23C 16/513 427/578 |
| 2005/0205412 A1* | 9/2005 | Rohrmann | C23C 14/352 204/192.12 |
| 2008/0246406 A1* | 10/2008 | Chen | H01J 37/32082 315/111.41 |
| 2014/0042022 A1* | 2/2014 | Xu | C23C 14/566 204/298.15 |

* cited by examiner

HELMHOLTZ COIL ASSISTED PECVD CARBON SOURCE

DETAILED DESCRIPTION OF THE INVENTION

In the following description, reference is made to the accompanying drawings, which form a part hereof, and in which is shown by way of illustration a specific example in which the invention may be practiced. It is to be understood that other embodiments may be utilized and structural changes may be made without departing from the scope of the embodiments.

General Overview:

It should be noted that the descriptions that follow, for example, in terms of a Helmholtz coil assisted PECVD carbon source is described for illustrative purposes and the underlying system can apply to any number and multiple types of material deposition processes. In one embodiment, the Helmholtz coil assisted PECVD carbon source can be configured using paired polarity Helmholtz coils. The Helmholtz coil assisted PECVD carbon source can be configured to include at least two reflective polarity rear button permanent magnets and can be configured to include at least two paired electric currents connected to the paired polarity Helmholtz coils using the present invention.

Figure 1:
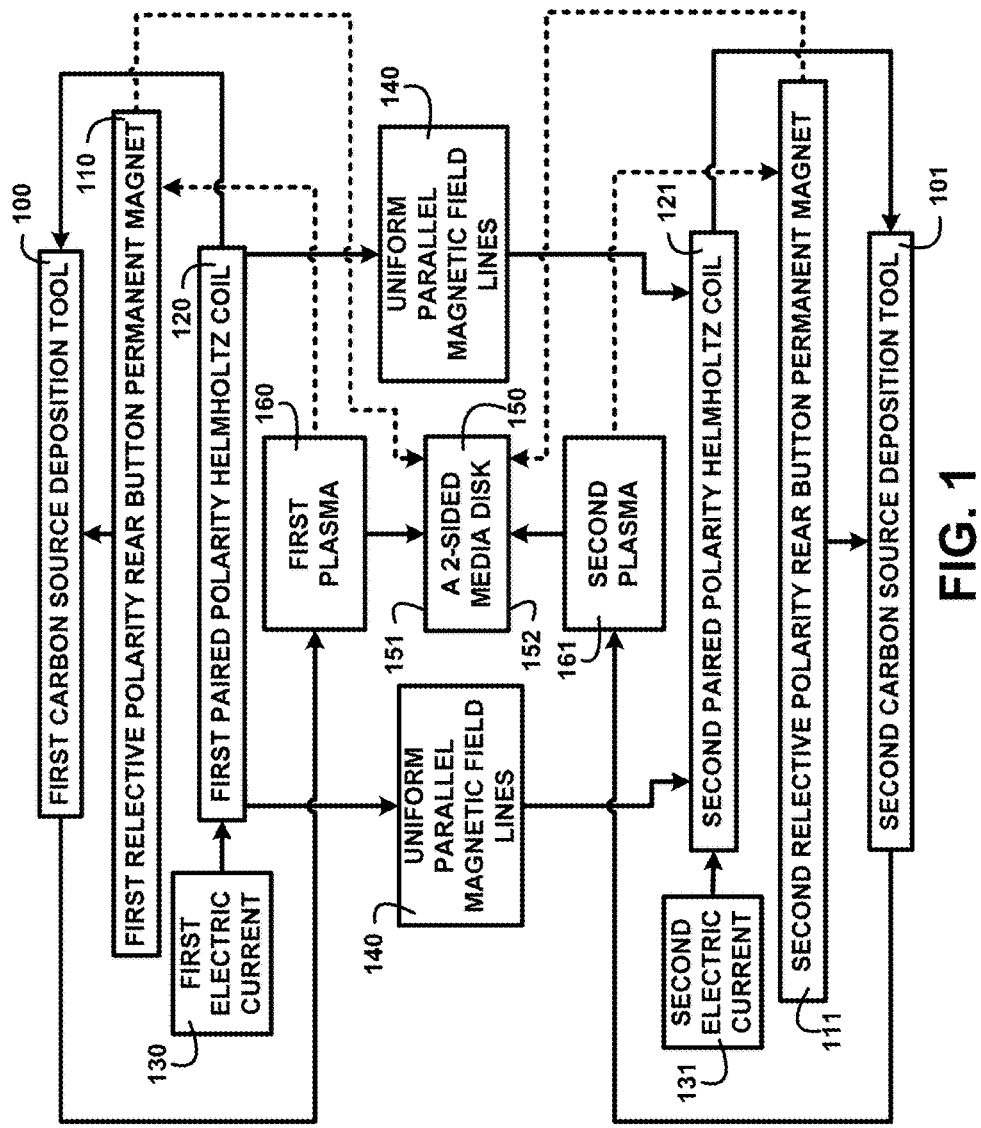
FIG. 1 shows a block diagram of an overview of a Helmholtz coil assisted PECVD carbon source of one embodiment.

FIG. 1 shows a block diagram of an overview of a Helmholtz coil assisted PECVD carbon source of one embodiment. FIG. 1 shows a first carbon source deposition tool 100 including a first reflective polarity rear button permanent magnet 110, first paired polarity Helmholtz coil 120, first electric current 130, first plasma 160, uniform parallel axial magnetic field lines 140, first side of a 2-sided media disk 151 and a 2-sided media disk 150. FIG. 1 shows a second carbon source deposition tool 101 including a second reflective polarity rear button permanent magnet 111, second paired polarity Helmholtz coil 121, second electric current 131, second plasma 161, uniform parallel axial magnetic field lines 140, second side of a 2-sided media disk 152 and a 2-sided media disk 150. Helmholtz coils are used to produce magnetic fields that can control plasma density and uniformity within the carbon source.

Controlling the uniformity of the media carbon overcoat (COC) film growth can affect the mechanical and recording performance of the media. The areas of the disk with the thinnest COC pose the greatest risk for media corrosion, carbon-lube issues, and durability issues. The circumferential once-around (OAR) carbon thickness uniformity impacts the bit error rate (BER) OAR performance due to head-media spacing variation. Recording subsystem performance can be limited by BER variation contributions from the media overcoat non-uniformity.

NCT (New Technology Carbon) sources use a hot filament cathode to emit electrons by thermionic emission. The acceleration of those electrons results in a plasma in a PECVD (plasma enhanced chemical vapor deposition) media overcoat process. The plasma physics and surface chemistry (on all surfaces in the chamber, including the disk) dictate the uniformity, deposition rate, and properties of the carbon thin films. While permanent magnets serve to push the plasma away from the chamber walls, there is no significant magnetic field in the central portion of the chamber to control the plasma density and distribution within the source chamber.

The contribution of primary electrons to the plasma from the filament, are largely uncontrolled due to the simple nature of the hot filament cathode (a wire with electric current running through it). Electron mobility can be strongly affected by magnetic fields, i.e. electrons like to travel along magnetic field lines and not perpendicular to them. Addition of the control of the magnetic fields from the first paired polarity Helmholtz coil 120 and second paired polarity Helmholtz coil 121 stabilizes the largely uncontrolled plasma in the center of the NCT source.

DETAILED DESCRIPTION

Figure 2:
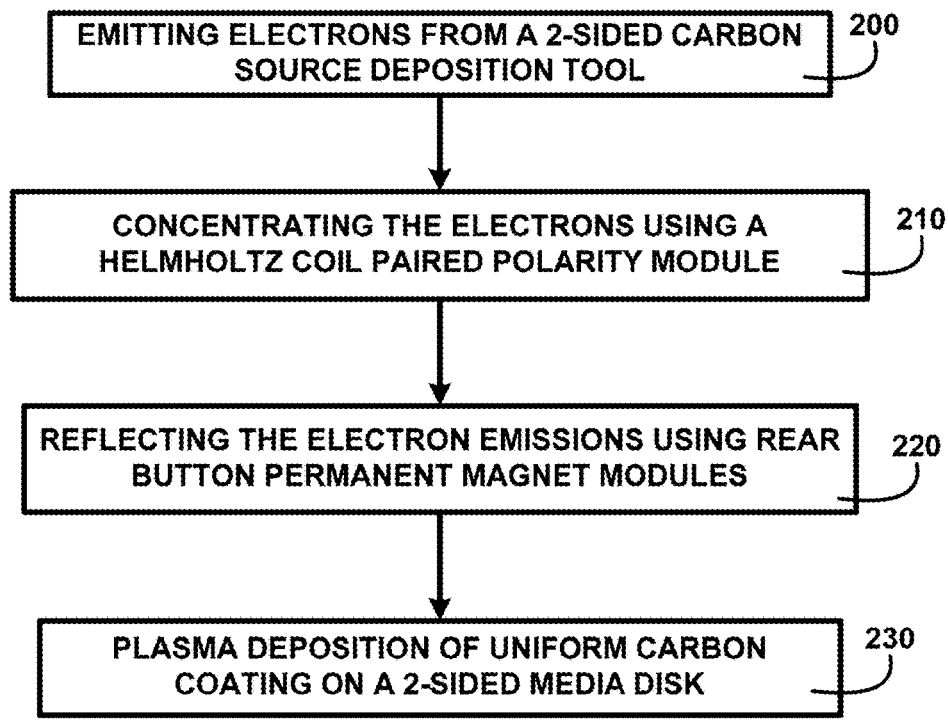
FIG. 2 shows a block diagram of an overview flow chart of a Helmholtz coil assisted PECVD carbon source of one embodiment.

FIG. 2 shows a block diagram of an overview flow chart of a Helmholtz coil assisted PECVD carbon source of one embodiment. Magnetic fields are used to control plasma density and distribution within a PECVD carbon source. The Helmholtz coils produce a uniform magnetic field between separate coils mounted on each carbon source of a 2-sided deposition system. The magnetic field strength and gradient can be controlled to optimize the carbon deposition process.

FIG. 2 shows emitting electrons from a 2-sided carbon source deposition tool 200. Concentrating the electrons using a Helmholtz coil paired polarity module 210. Reflecting the electron emissions using rear button permanent magnet modules 220 configured to pinch magnetic fields down at the ends of a magnetic bottle. Plasma deposition of uniform carbon coating on a 2-sided media disk 230. Since the media deposition tool is 2-sided, putting single coils on each NCT source on either side of the chamber (with the disk in the middle) produces a natural configuration for Helmholtz field generation which will benefit both sources. The field is axial to the source, or perpendicular to the disk surface. The Helmholtz field generation controls the traveling path of the electrons where electrons are confined in the middle due to parallel magnetic fields and reflect from the ends due to a magnetic mirror effect. The reflection at the ends occurs due to the higher magnetic field density and results in a greater density of energetic electrons in the center of the bottle. The rear button permanent magnets of the NCT source are configured with a polarity that produces a magnetic bottle when the 2 NCT sources are combined on the sputter tool of one embodiment.

Figure 3:
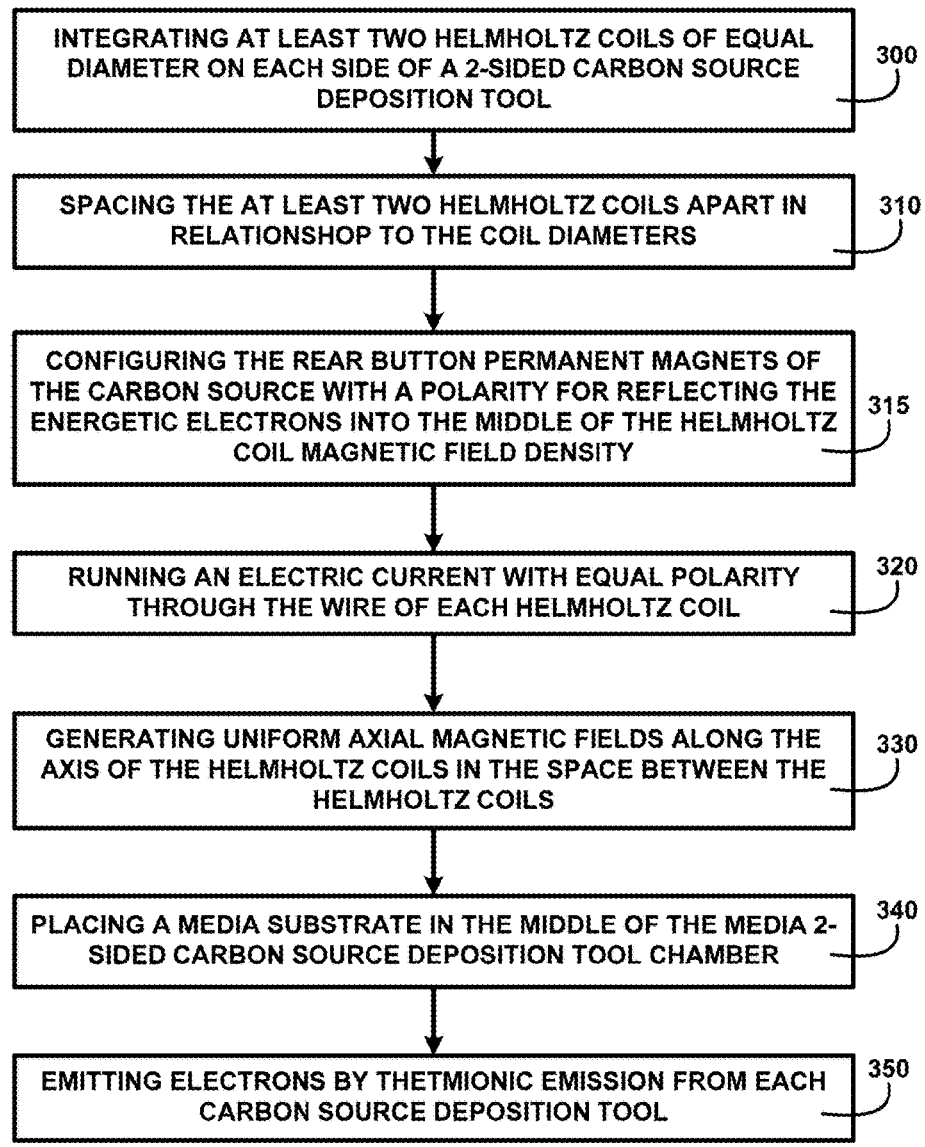
FIG. 3 shows a block diagram of an overview flow chart of Helmholtz coil assisted PECVD carbon source apparatus of one embodiment.

FIG. 3 shows a block diagram of an overview flow chart of Helmholtz coil assisted PECVD carbon source apparatus of one embodiment. FIG. 3 shows integrating at least two Helmholtz coils of equal diameter on each side of a 2-sided carbon source deposition tool 300. The integration includes spacing the at least two Helmholtz coils apart in relationship to the coil diameters 310. Concentration of the electrons by the uniform axial magnetic fields is amplified by configuring the rear button permanent magnets of the carbon source with a polarity for reflecting the energetic electrons into the middle of the Helmholtz coil magnetic field density 315.

The uniform axial magnetic fields are generated by running an electric current with equal polarity through the wire of each Helmholtz coil 320. A current regulator may be used to adjust the current passing through the paired polarity Helmholtz coils when the diameter or placement (location) of the coil changed. The current regulator may be used to adjust the current passing through the paired polarity Helmholtz coils to change the shape and size of the magnetic field for example a magnetic bottle shape. Generating uniform axial magnetic fields along the axis of the Helmholtz coils in the space between the Helmholtz coils 330 confines the traveling path of the electrons. Uniform deposition of the carbon is achieved by placing a media substrate in the middle of the media 2-sided carbon source deposition tool chamber 340. The carbon material is supplied by emitting electrons by thermionic emission from each carbon source deposition tool 350 of one embodiment.

Figure 4:
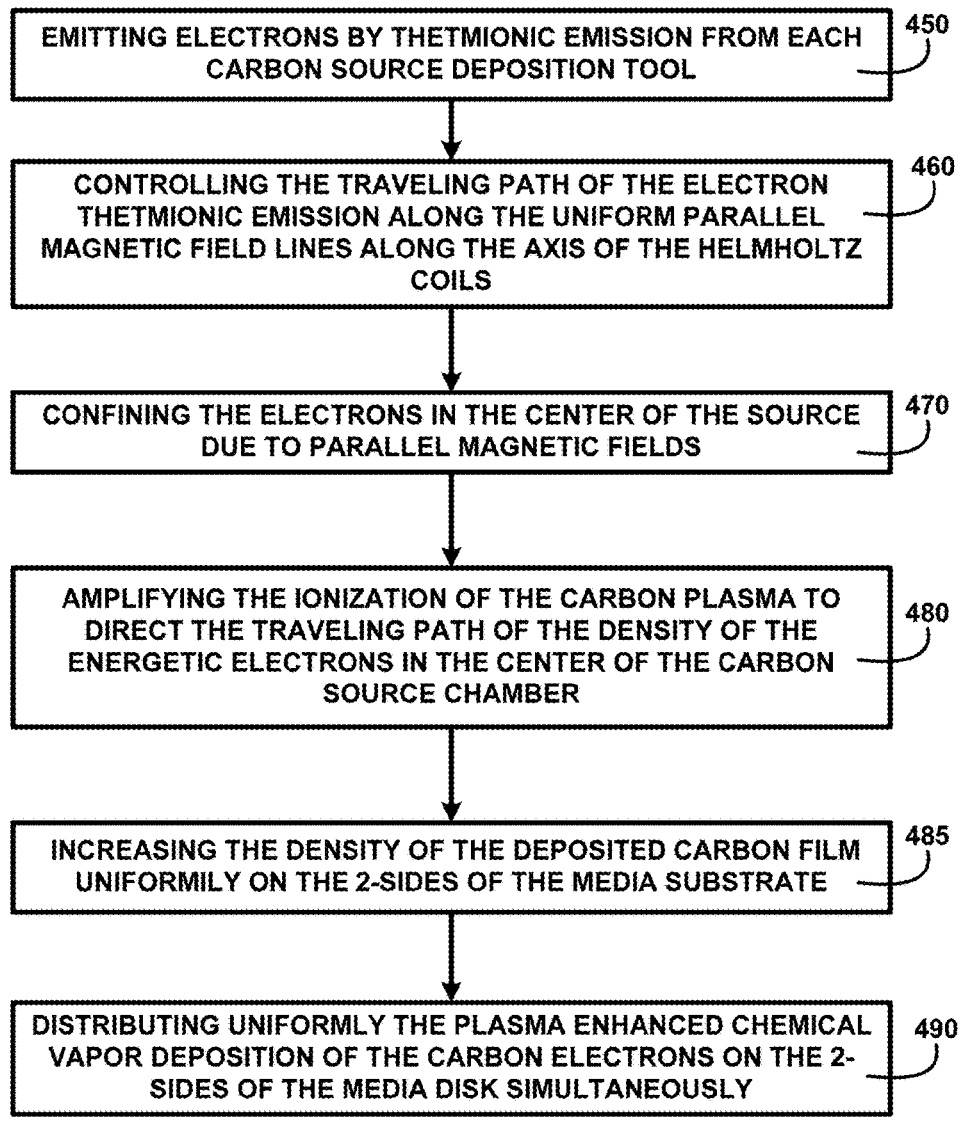
FIG. 4 shows a block diagram of an overview flow chart of Helmholtz coil assisted PECVD carbon source deposition of one embodiment.

FIG. 4 shows a block diagram of an overview flow chart of Helmholtz coil assisted PECVD carbon source deposition of one embodiment. FIG. 4 shows a Helmholtz coil assisted PECVD carbon source deposition process including emitting electrons by thermionic emission from each carbon source deposition tool 450. The field applied by the Helmholtz coil will be parallel to the positively biased anode surfaces, both post and ring portions. Controlling the traveling path of the electron thermionic emission along the uniform parallel axial magnetic field lines along the axis of the Helmholtz coils 460. Creation of a magnetic bottle will increase the ionization of the NCT plasma, since electrons will spend more time in the center of the source.

The density of electrons is increased by confining the electrons in the center of the source with axial magnetic fields 470. Annular electron drift around the center post and along the surface of the ring, induced by crossed electric and magnetic fields (E×B drift), will enhance ionization at the anode surfaces and improve circumferential plasma uniformity near the anode post. Plasma uniformity is achieved by evenly distributing the energetic electrons in the center of the carbon source chamber 480. The paired Helmholtz coil assisted PECVD carbon source deposition process is used for distributing uniformly the plasma enhanced chemical vapor deposition on the 2-sides of the media disk simultaneously 490.

Figure 5:
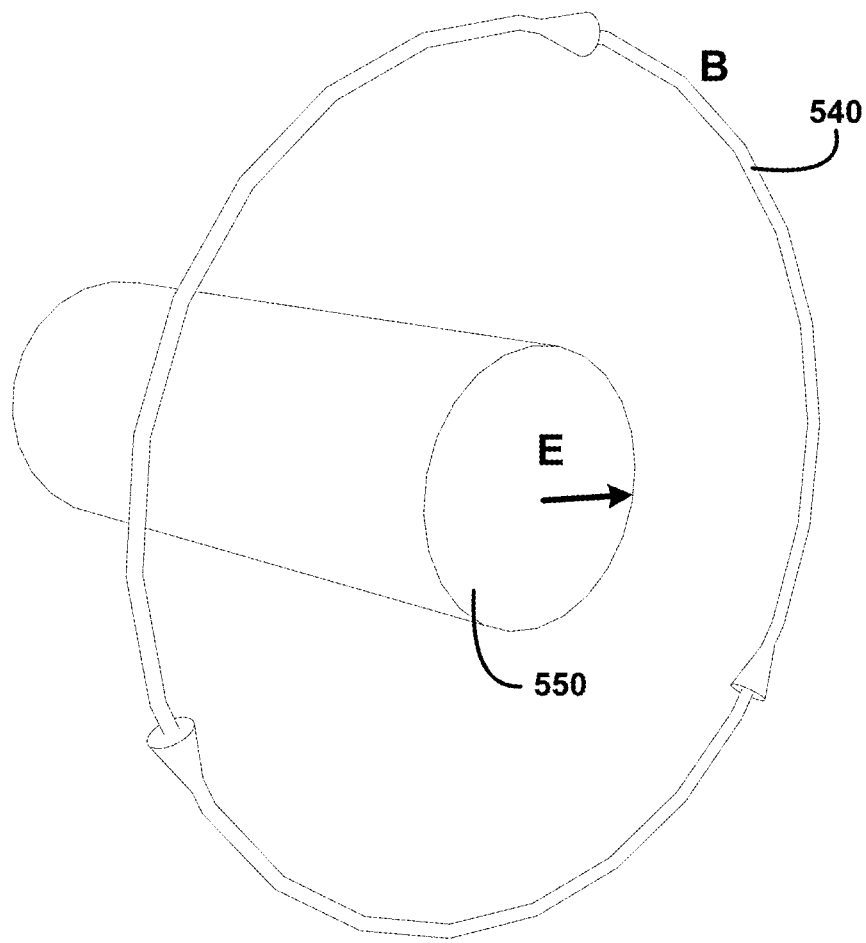
FIG. 5 shows for illustrative purposes only an example of electron annular drift around an anode post of one embodiment.

FIG. 5 shows for illustrative purposes only an example of electron annular drift emitted from an anode post of one embodiment. Annular electron drift occurs with the interaction of an anode post 550 electric fields (E) and a magnetic field (B) 540. Annular electron drift occurs with a drift velocity v~E×B. The magnetic field (B) 540 applied by the Helmholtz coil will be parallel to the anode surfaces (both post these positively biased surfaces (see figure of cross-sectional view). Annular electron drift around the center anode post 550 and along the surface of the anode ring, induced by crossed electric and magnetic fields (E×B drift), may enhance ionization at the anode surfaces and improve overall plasma uniformity within the volume of the chamber.

Figure 6:
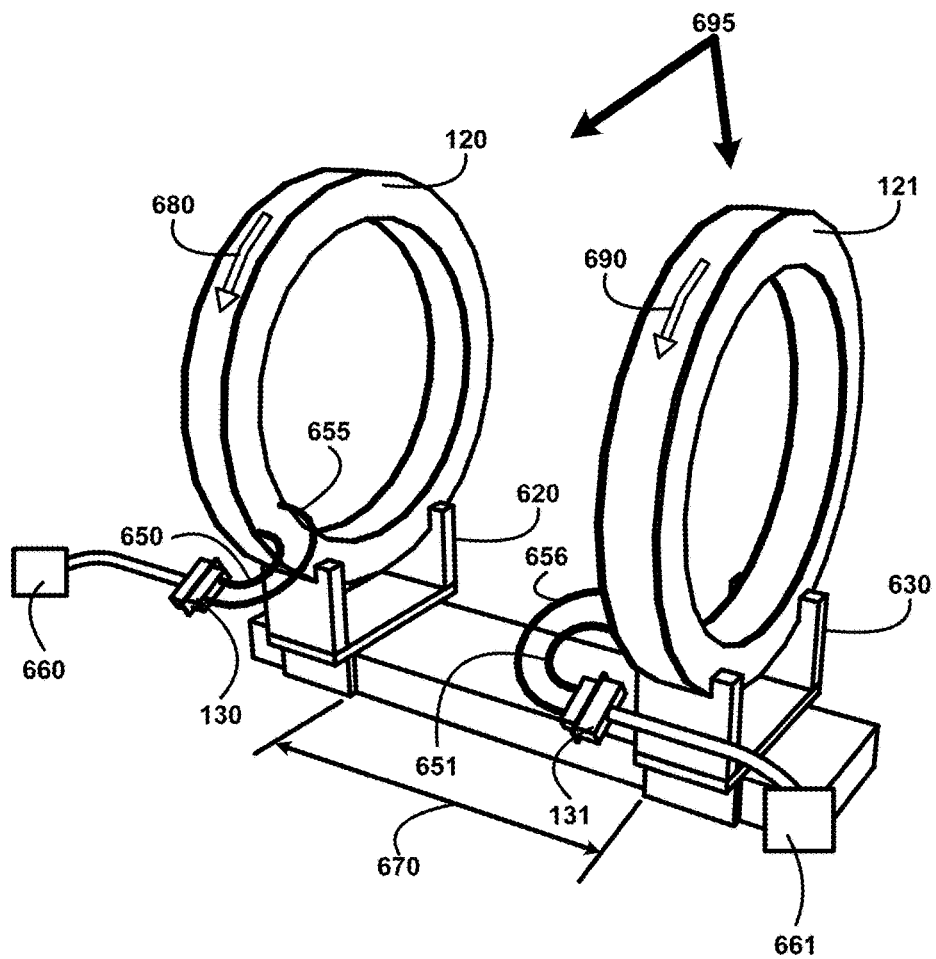
FIG. 6 shows for illustrative purposes only an example of paired polarity Helmholtz coils of one embodiment.

FIG. 6 shows for illustrative purposes only an example of paired polarity Helmholtz coils of one embodiment. FIG. 6 shows paired polarity Helmholtz coils 695. Helmholtz coils are windings of thin wire on a spool or bobbin. By running an electric current through the wire of each coil magnetic fields are generated (described by the Biot-Savart Law, with direction indicated by the right-hand rule). The paired polarity Helmholtz coils 695 include the first paired polarity Helmholtz coil 120 and the second paired polarity Helmholtz coil 121.

The first paired polarity Helmholtz coil 120 includes a connection to the first electric current 130 and a first current regulator 660 used to adjust the current passing through the first paired polarity Helmholtz coil 120. The first electric current 130 includes a first negative pole 650 and a first positive pole 655. In this illustration, the first paired polarity Helmholtz coil 120 is supported on a first paired polarity Helmholtz coil mount 620. The first electric current 130 generates a first paired polarity Helmholtz coil current flow direction 680.

The second paired polarity Helmholtz coil 121 includes a connection to the second electric current 131 and a second current regulator 661 used to adjust the current passing through the second paired polarity Helmholtz coil 121. The second electric current 131 includes a second negative pole 651 and a second positive pole 656. The second paired polarity Helmholtz coil 121 is supported on a second paired polarity Helmholtz coil mount 730. The second electric current 131 generates a second paired polarity Helmholtz coil current flow direction 690.

Helmholtz coils can provide a uniform axial magnetic field in the space between the coils 670. The current polarity is the same for each coil (paired). When the sense of the current polarity is the same for each coil (paired), then a highly uniform field will be generated along the axis of the coils in the space between the coils 670. The uniformity of the field is optimized when the coil diameter is similar to the spacing of the coils. By changing the spacing and/or the diameter of the coils, the shape of the magnetic field lines can vary. Since the traveling path of electrons reacts strongly with magnetic field lines, the electrons may be confined by the parallel magnetic field and be more uniformly distributed.

Figure 7:
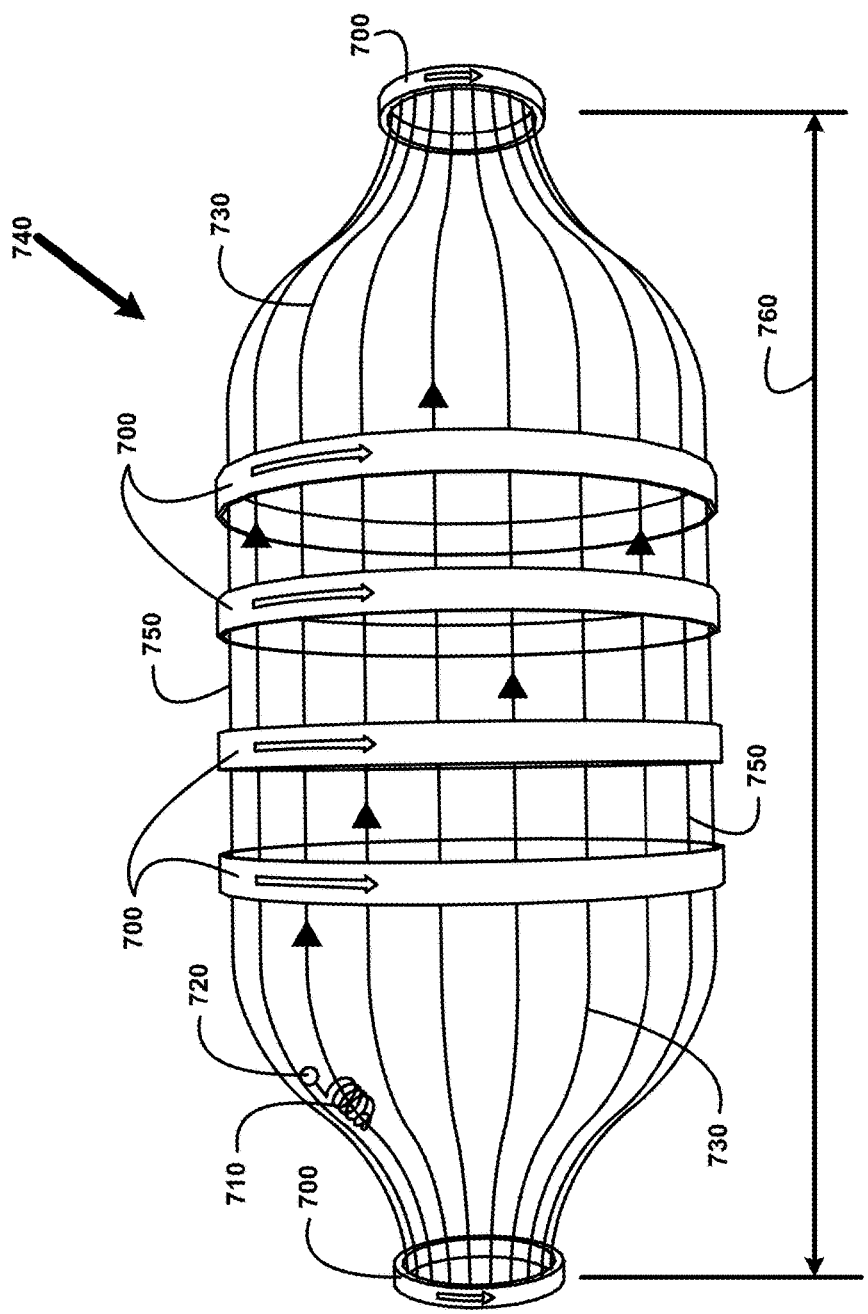
FIG. 7 shows for illustrative purposes only an example of the concept of a magnetic bottle of one embodiment.

FIG. 7 shows for illustrative purposes only an example of the concept of a magnetic bottle of one embodiment. FIG. 7 shows the concept of a magnetic bottle formed by configuring the rear button permanent magnets of the carbon source with a polarity for reflecting the energetic electrons into the middle of the Helmholtz coil magnetic field density 315 of FIG. 3. Running an electric current with equal polarity through the wire of each Helmholtz coil 320 of FIG. 3 is used for generating uniform axial magnetic fields along the axis of the Helmholtz coils in the space between the Helmholtz coils 330 of FIG. 3. An electric current with equal polarity 700 is passed through each of the Helmholtz coils.

The shape of the magnetic fields is predetermined by the spacing of at least two Helmholtz coils 760. Helical motion 710 is experienced by an electron 720. The traveling path of the electron 720 is controlled by the magnetic field 730. The motion 710 travels within a magnetic bottle 740 formed by the uniform parallel axial magnetic field lines 750 perpendicular to the surfaces of a media disk of one embodiment. Reflection of the electron occurs at the end of the "bottle" due to the pinching of the magnetic fields as they converge to the button magnet.

Figure 8:
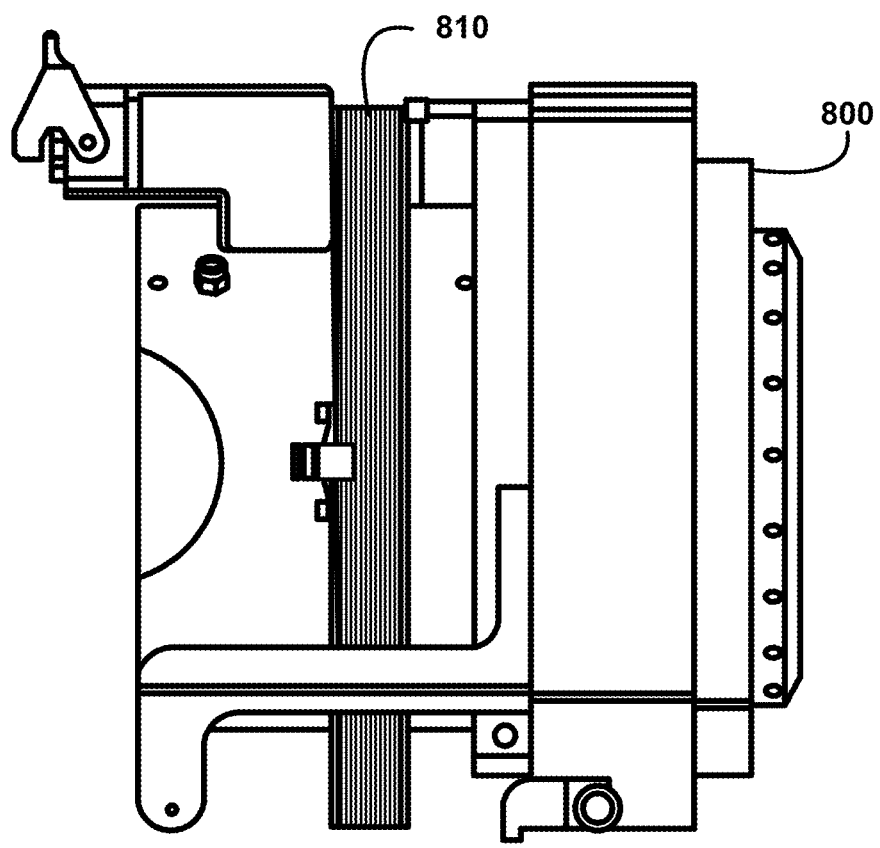
FIG. 8 shows for illustrative purposes only an example of an H-coil mounted on a carbon source of one embodiment.

FIG. 8 shows for illustrative purposes only an example of an H-coil mounted on a carbon source of one embodiment. FIG. 8 shows an exterior view of a carbon source deposition tool 800 with an integrated Helmholtz coil 810 of one embodiment.

Figure 9:
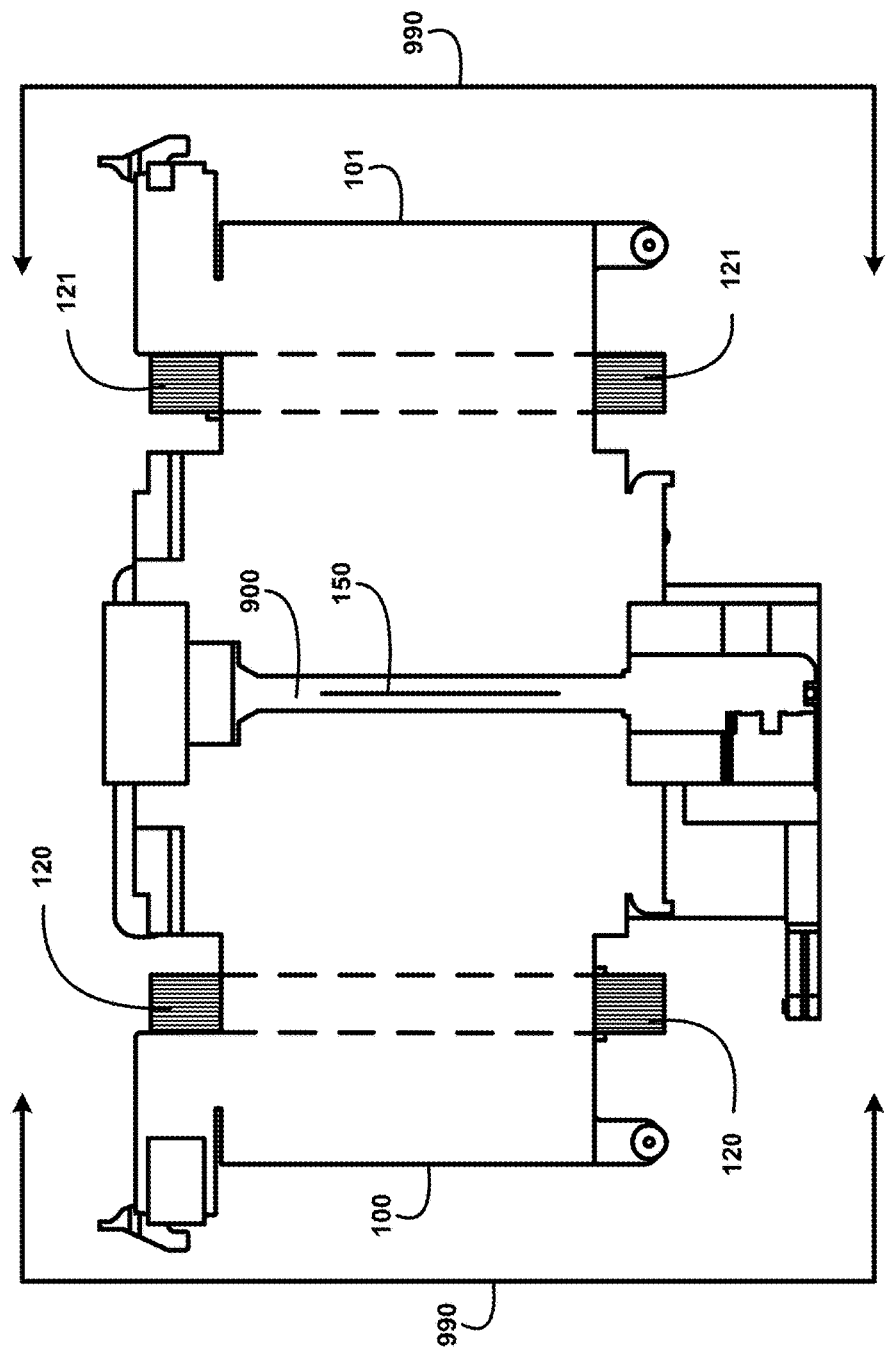
FIG. 9 shows for illustrative purposes only an example of paired polarity Helmholtz coils integrated on a two-sided carbon source of one embodiment.
Figure 10:
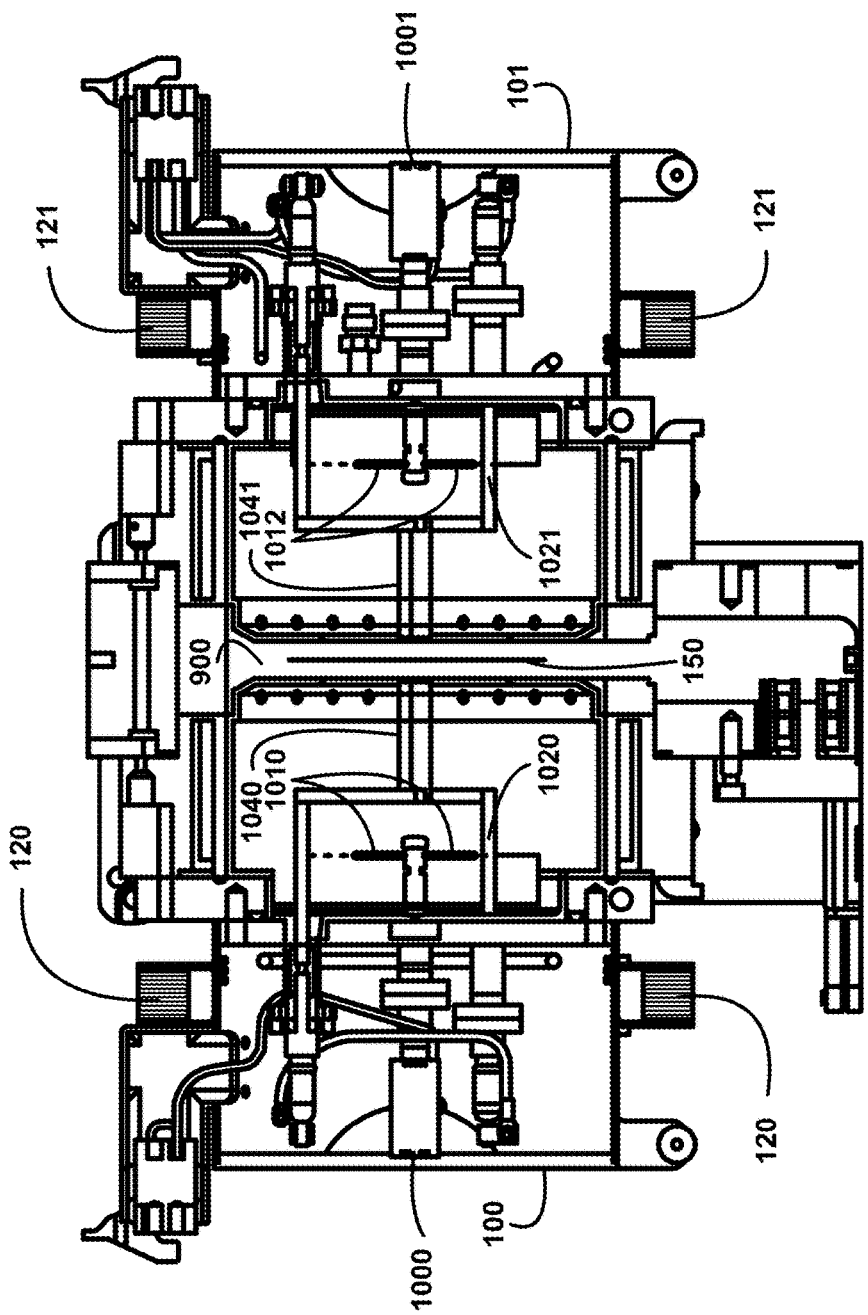
FIG. 10 shows for illustrative purposes only an example of a cross-sectional view of a NCT source pair with integrated paired Helmholtz coils of one embodiment.

FIG. 9 shows for illustrative purposes only an example of paired polarity Helmholtz coils integrated on a two-sided carbon source of one embodiment. FIG. 9 shows an exterior view of the first carbon source deposition tool 100 with the first paired polarity Helmholtz coil 120 and the second carbon source deposition tool 101 with the second paired polarity Helmholtz coil 121. Between the 2-sided carbon source deposition tool is a deposition chamber 900 in which is placed a 2-sided media disk 150. FIG. 10 shows a cross-sectional view as delineated by section line 990 of one embodiment.

FIG. 10 shows for illustrative purposes only an example of a cross-sectional view of a NCT source pair with integrated paired Helmholtz coils of one embodiment. FIG. 10 shows a first carbon source deposition tool 100 and a second carbon source deposition tool 101. The first carbon source deposition tool 100 includes the first paired polarity Helmholtz coil 120. The second carbon source deposition tool 101 includes the second paired polarity Helmholtz coil 121. The chamber 900 formed by the two carbon source deposition tools holds the 2-sided media disk 150. A first filament cathode 1010 and a second filament cathode 1012 are heated and are the source of the electron emissions. The filament is configured to be heated using the filament cathode to emit electrons accelerated to form a plasma. The first carbon source deposition tool 100 includes a first anode ring 1020, a first anode post 1040 and a first rear button permanent magnet 1000. The second carbon source deposition tool 101 includes a second anode ring 1021, a second anode post 1041 and a second rear button permanent magnet 1001 of one embodiment.

Figure 11:
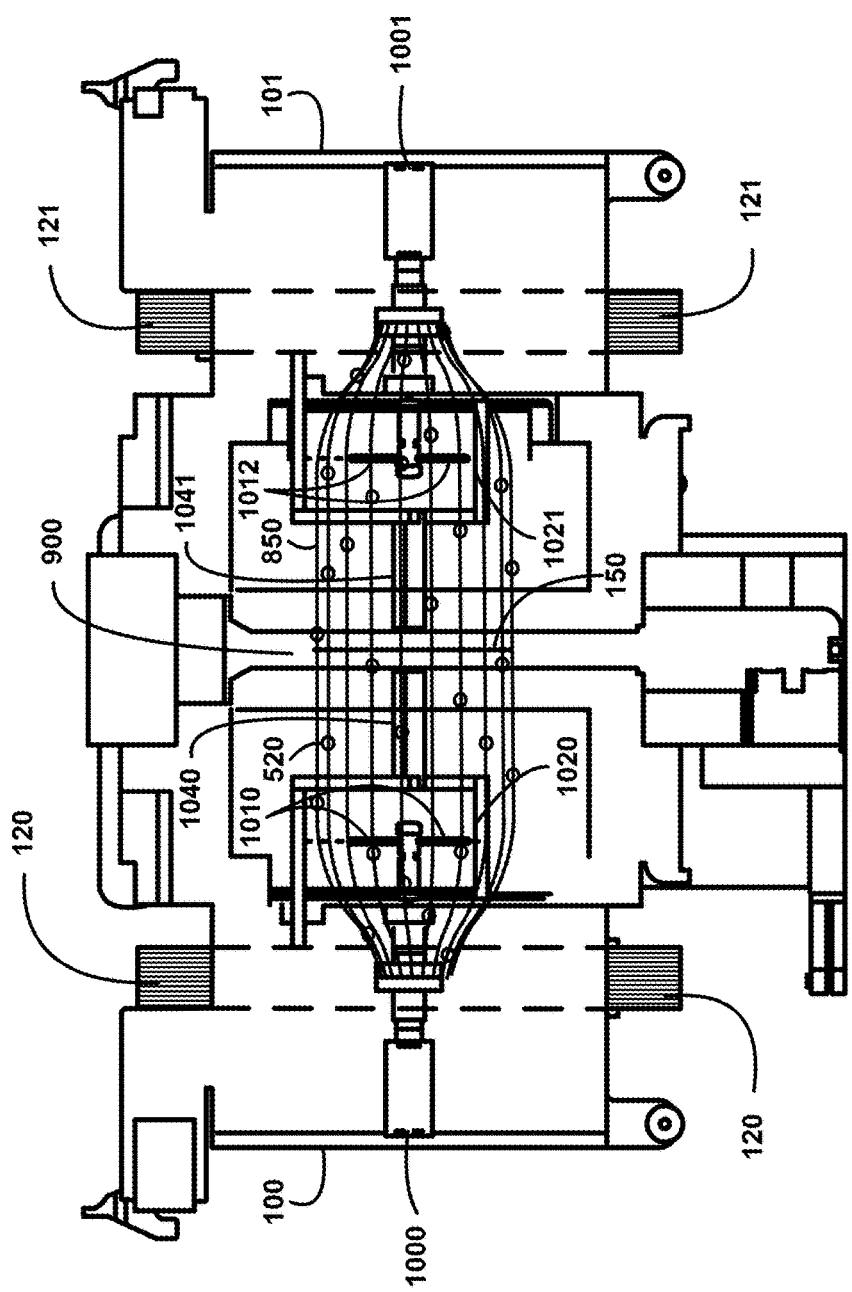
FIG. 11 shows for illustrative purposes only an example of concentrating the electrons of one embodiment.

FIG. 11 shows for illustrative purposes only an example of concentrating the electrons of one embodiment. FIG. 11 shows a first carbon source deposition tool 100 and a second carbon source deposition tool 101. The first carbon source deposition tool 100 includes an integrated first paired polarity Helmholtz coil 120. The second carbon source deposition tool 101 includes an integrated second paired polarity Helmholtz coil 121. The first carbon source deposition tool 100 and a second carbon source deposition tool 101 form a 2-sided carbon source deposition tool including a deposition chamber 900. The deposition chamber 900 includes a holder for a 2-sided media disk 150.

The first carbon source deposition tool 100 includes a first filament cathode 1010, first anode ring 1020, first anode post 1040 and a first rear button permanent magnet 1000 configured with a predetermined reflective polarity. The second carbon source deposition tool 101 includes a second filament cathode 1012, second anode ring 1021, second anode post 1041 and a second rear button permanent magnet 1001 configured with a predetermined reflective polarity. In various embodiments, predetermined coil spacing, current, and temperature of at least one of the electron emitting filaments may be regulated to control a uniform carbon deposition rate and deposition thickness.

FIG. 11 shows the uniform parallel axial magnetic field lines 750 generated by the first paired polarity Helmholtz coil 120 and second paired polarity Helmholtz coil 121. The uniform parallel axial magnetic field lines 750 confine the emitted electrons and reflected electrons to uniformly deposit a carbon coating onto the surfaces of a two-sided media disk. Each electron 720 reacts to the uniform parallel axial magnetic field lines 750 wherein the electron travel is concentrated within the magnetic bottle perpendicular to the surfaces of the 2-sided media disk and deposited onto the surfaces uniformly of one embodiment.

Figure 12:
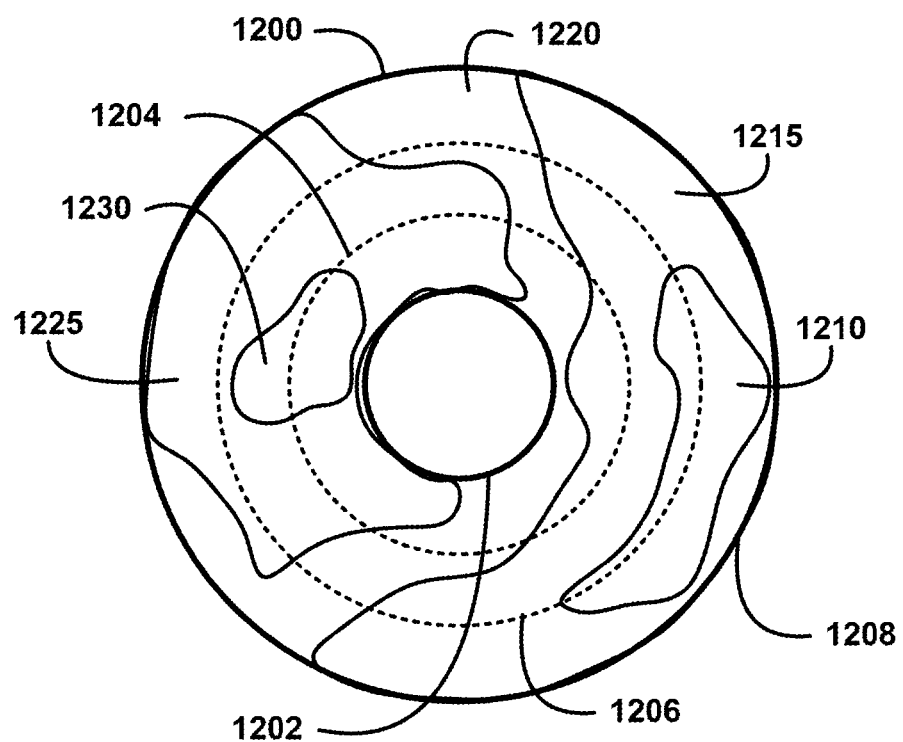
FIG. 12 shows for illustrative purposes only an example of non-uniform carbon coating on disk of one embodiment.

FIG. 12 shows for illustrative purposes only an example of non-uniform carbon coating on disk of one embodiment. FIG. 12 shows one side of a media disk substrate 1200 including an inner edge of disk 1202, inner radii 1204, outer radii 1206, and outer edge of disk 1208. A carbon deposition was made without using the Helmholtz coil assisted PECVD carbon source wherein an non-uniform coating deposition was produced including a first carbon deposit thickness 1210, second carbon deposit thickness 1215, third carbon deposit thickness 1225, fourth carbon deposit thickness 1230, and a fifth carbon deposit thickness 1220.

Figure 13:
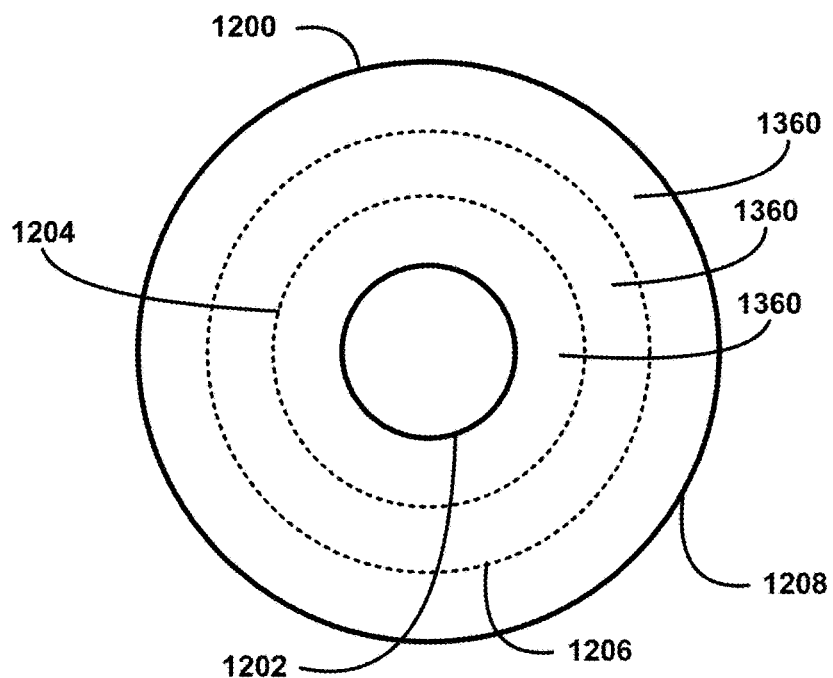
FIG. 13 shows for illustrative purposes only an example of uniform carbon coating on disk of one embodiment.

FIG. 13 shows for illustrative purposes only an example of uniform carbon coating on disk of one embodiment. FIG. 13 shows one side of a media disk substrate 1200 including an inner edge of disk 1202, inner radii 1204, outer radii 1206 and outer edge of disk 1208. The media disk surface includes a uniform carbon coating deposit thickness 1360 deposited using the Helmholtz coil assisted PECVD carbon source of one embodiment.

Figure 14:
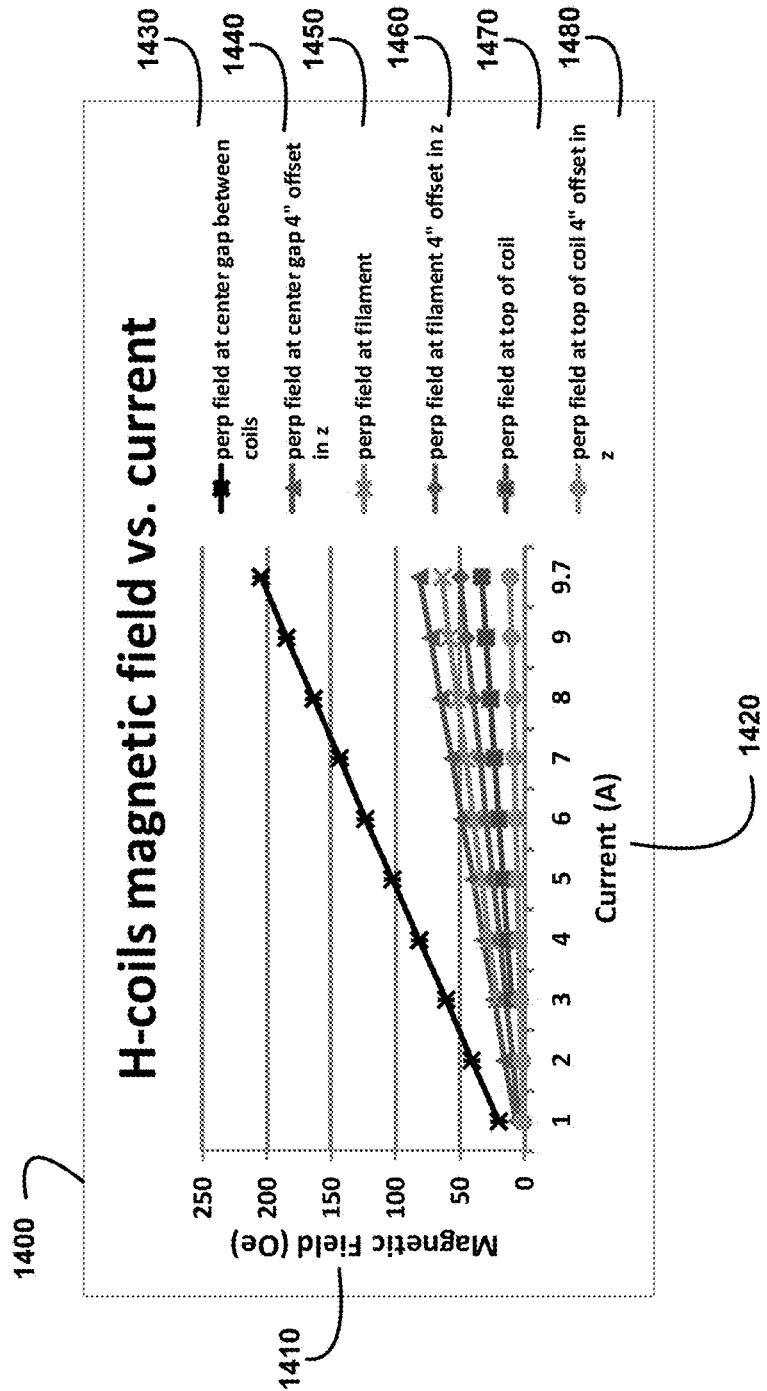
FIG. 14 shows for illustrative purposes only an example of H-coils magnetic field vs. current of one embodiment.

FIG. 14 shows for illustrative purposes only an example of H-coils magnetic field vs. current of one embodiment. FIG. 14 shows a graphic chart illustration of H-coils magnetic field vs. current 1400 showing the magnitude of the magnetic field (Oe) 1410 generated by the Helmholtz coils with various predetermined current (A) 1420 running in the coils. In this description on the chart "perp" denotes perpendicular. The chart shows a magnetic field strength value much greater than the other field values at a perp field at center gap between coils 1430. The balance of the magnetic field strengths are lower at a perp field at center gap 4" offset in z 1440, perp field at filament 1450, perp field at filament 4" offset in z 1460, perp field at top of coil 1470 and a perp field at top of coil 4" offset in z 1480 of one embodiment.

In one embodiment, an apparatus, comprises at least two carbon source deposition tool for emitting electrons, at least two reflective polarity rear button permanent magnets integrated into the carbon source deposition tools for reflecting emitted electrons, and at least two paired polarity Helmholtz coils integrated into the carbon source deposition tools for forming uniform parallel magnetic field lines for confining the emitted electrons to uniformly deposit carbon onto the surfaces of a two-sided media disk. In one embodiment, the apparatus is further comprising a first carbon source deposition tool and a second carbon source deposition tool configured to form a deposition chamber. In another embodiment, the apparatus is further comprising a first paired polarity Helmholtz coil integrated into a first carbon source deposition tool.

One embodiment of the apparatus further comprises a second paired polarity Helmholtz coil integrated into a second carbon source deposition tool. According to one embodiment, the apparatus is further comprising a first electric current configured to connect to a first paired polarity Helmholtz coil and configured to form a first paired polarity Helmholtz coil current flow direction. In one embodiment, the apparatus is further comprising a second electric current configured to connect to a second paired polarity Helmholtz coil and configured to form a second paired polarity Helmholtz coil current flow direction. In one embodiment, the apparatus is further comprising a first and second paired polarity Helmholtz coil integrated into a first and second carbon source deposition tool configured to produce first and second uniform parallel magnetic field lines to confine and concentrate first and second emitted electrons into a deposition chamber.

In another embodiment, the apparatus is further comprising a first reflective polarity rear button permanent magnet integrated into a first carbon source deposition tool and a second reflective polarity rear button permanent magnet integrated into a second carbon source deposition tool configured with predetermined magnetic fields for reflecting first and second emitted electrons into a deposition chamber. One embodiment of the apparatus further comprises a deposition chamber configured to hold a two-sided media disk during a deposition process within first and second uniform parallel magnetic field lines. According to one embodiment, the apparatus further comprises paired polarity Helmholtz coils configured with a predetermined spacing between coils in relationship to the coil diameters for producing first and second uniform parallel magnetic field lines for confining and concentrating emitted electrons.

In one embodiment, a method, comprises emitting electrons from a 2-sided carbon source deposition tool module, concentrating the emitted electrons using a Helmholtz coil paired polarity module integrated into the 2-sided carbon source deposition tool, and reflecting the electron emissions using at least two rear button permanent magnet modules for depositing the concentrated electrons uniformly on a 2-sided media disk. In one embodiment, the 2-sided carbon source deposition tool module forms a deposition chamber configured to hold the 2-sided media disk.

According to one embodiment, the Helmholtz coil paired polarity module is configured to include at least two Helmholtz coils connected to at least two electric currents with predetermined polarities. In another embodiment, the paired polarity Helmholtz coils are configured with a predetermined spacing between coils for producing first and second uniform parallel magnetic field lines for confining and concentrating emitted electrons. In one embodiment, emitting electrons from a 2-sided carbon source deposition tool module is configured to form a deposition chamber configured to hold a two-sided media disk during a deposition process within first and second uniform parallel magnetic field lines.

Also provided herein is an apparatus, comprising a means to emit electrons from a 2-sided carbon source, a means to confine and reflect emitted electrons traveling path along predetermined uniform Helmholtz parallel axial magnet field lines, and a means to uniformly deposit confined and reflected emitted electrons on both sides of a 2-sided media disk. In another embodiment, the apparatus further comprises means for producing two paired Helmholtz magnetic field generations with predetermined polarity to form uniform parallel axial magnet field lines. According to one embodiment, the apparatus is further comprising means for holding in a deposition chamber a 2-sided media disk with surfaces perpendicular to the confined and reflected emitted electrons traveling path along predetermined uniform parallel axial magnet field lines.

One embodiment of the apparatus further comprises means for integrating at least two Helmholtz coils of equal diameter on each side of a 2-sided carbon source deposition tool. In one embodiment, the apparatus is further comprising means for integrating at least two rear button permanent magnets on each side of a 2-sided carbon source deposition tool configured with a polarity for reflecting the energetic electrons into the middle of a Helmholtz coil magnetic field density.

The foregoing has described the principles, embodiments and modes of operation of the embodiments. However, the invention should not be construed as being limited to the particular embodiments discussed. The above described embodiments should be regarded as illustrative rather than restrictive, and it should be appreciated that variations may be made in those embodiments by workers skilled in the art without departing from the scope of the embodiments as defined by the following claims.

What is claimed is:

1. An apparatus, comprising:
   at least two carbon source deposition tools for emitting electrons including a first carbon source deposition tool and a second carbon source deposition tool; and
   at least two Helmholtz coils integrated into the carbon source deposition tools configured to form uniform parallel magnetic field lines perpendicular to a two-sided media disk for confining the emitted electrons to uniformly deposit carbon onto the surfaces of the two-sided media disk, wherein
      the at least two Helmholtz coils include a first Helmholtz coil and a second Helmholtz coil,
      the first Helmholtz coil is positioned between a first rear button permanent magnet and a first filament cathode,
      a first anode post is positioned between the first filament cathode and a deposition chamber, and
      a second anode post is positioned between a second filament cathode and the deposition chamber.

2. The apparatus of claim 1, further comprising a first current regulator connected to one of the Helmholtz coils and configured to adjust current in a first Helmholtz coil current flow direction.

3. The apparatus of claim 1, further comprising a second current regulator connected to one of the Helmholtz coils and configured to adjust current in a second Helmholtz coil current flow direction.

4. The apparatus of claim 1, wherein the deposition chamber is configured to hold the two-sided media disk during a deposition process within the uniform parallel magnetic field lines.

5. The apparatus of claim 1, the Helmholtz coils are configured with a predetermined spacing between coils in relationship to coil diameters for producing the uniform parallel magnetic field lines for confining and concentrating the emitted electrons.

6. An apparatus, comprising:
   at least two Helmholtz coils integrated into two carbon source deposition tools configured to direct electron deposition of carbon perpendicularly onto a two-sided media disk, wherein the at least two Helmholtz coils include a first Helmholtz coil and a second Helmholtz coil;
   at least two reflective polarity rear button permanent magnets integrated into the carbon source deposition tools, wherein the at least two reflective polarity rear button permanent magnets include a first rear button permanent magnet and a second rear button permanent magnet;

a current regulator used to adjust the current passing through the Helmholtz coils; and electron emitting filaments integrated into the carbon source deposition tools, wherein predetermined coil spacing, current, and temperature is regulated to control a uniform carbon deposition rate and deposition thickness, wherein the electron emitting filaments include a first electron emitting filament and a second electron emitting filament, the first Helmholtz coil is positioned between the first rear button permanent magnet and the first electron emitting filament, a first anode post is positioned between the first electron emitting filament and a deposition chamber, a first deposition tool includes the first Helmholtz coil, the first rear button permanent magnet and the first electron emitting filament, a second deposition tool includes the second Helmholtz coil, the second rear button magnet, and the second electron emitting filament, and a second anode post is positioned between the second electron emitting filament and the deposition chamber.

7. The apparatus of claim 6, wherein the two Helmholtz coils produce uniform parallel magnetic field lines for confining and concentrating emitted electrons.

8. The apparatus of claim 6, wherein the carbon source deposition tools produce first and second plasmas that are configured to be concentrated within the two Helmholtz coils produced uniform parallel magnetic field lines.

9. The apparatus of claim 6, wherein the at least one electron emitting filament is configured to emit electrons accelerated to form a plasma.

10. The apparatus of claim 6, wherein the at least two reflective polarity rear button permanent magnets are configured to pinch magnetic fields down at ends of a magnetic bottle.

* * * * *